US009390962B1

(12) United States Patent
Ko et al.

(10) Patent No.: US 9,390,962 B1
(45) Date of Patent: Jul. 12, 2016

(54) METHODS FOR FABRICATING DEVICE SUBSTRATES AND INTEGRATED CIRCUITS

(71) Applicant: GLOBALFOUNDRIES Singapore Pte. Ltd., Singapore (SG)

(72) Inventors: Lian Hoon Ko, Singapore (SG); Yung Fu Chong, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/639,645

(22) Filed: Mar. 5, 2015

(51) Int. Cl.
*H01L 21/76* (2006.01)
*H01L 21/762* (2006.01)

(52) U.S. Cl.
CPC ...... *H01L 21/7621* (2013.01); *H01L 21/76229* (2013.01)

(58) Field of Classification Search
CPC ............. H01L 21/76224; H01L 21/76235; H01L 21/76202; H01L 21/763; H01L 21/76229
USPC .................................. 438/221, 424, 425, 427
See application file for complete search history.

(56) References Cited

U.S. PATENT DOCUMENTS

| 7,989,911 B1 | 8/2011 | Mehta et al. |
| 8,294,236 B2 | 10/2012 | Mitsuhira et al. |
| 2005/0095808 A1* | 5/2005 | Chiu ............... H01L 21/823481 438/425 |

* cited by examiner

Primary Examiner — Quoc Hoang
(74) Attorney, Agent, or Firm — Ingrassia Fisher & Lorenz, P.C.

(57) ABSTRACT

Methods for fabricating device substrates are provided where the device substrates have rounded trench corners in medium voltage (MV) and high voltage (HV) regions thereof to minimize interference with performance of MV or HV devices adjacent thereto. The fabricating methods involve thermally oxidizing a trench-forming area in an MV or HV region on a semiconductor substrate to form a silicon oxide layer having narrowed birds beak edges that create rounded trench shoulders semiconductor substrate. An isolation trench is then formed through the silicon oxide layer, into the semiconductor substrate, removing portion of the silicon oxide layer and leaving the birds beak edges. After removing the birds beak edges, an oxide layer is formed lining the trench and shoulders to create rounded trench corners in the MV or HV region. Trenches having rounded corners may be formed simultaneously with forming trenches in low voltage regions that don't have rounded trench corners.

20 Claims, 6 Drawing Sheets

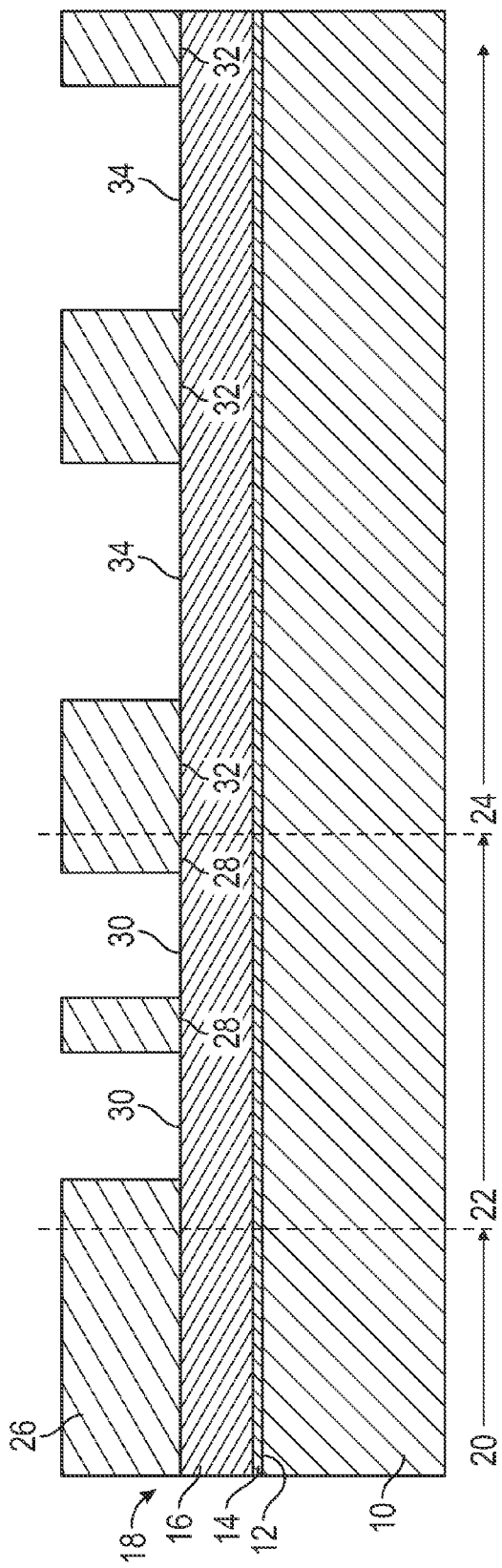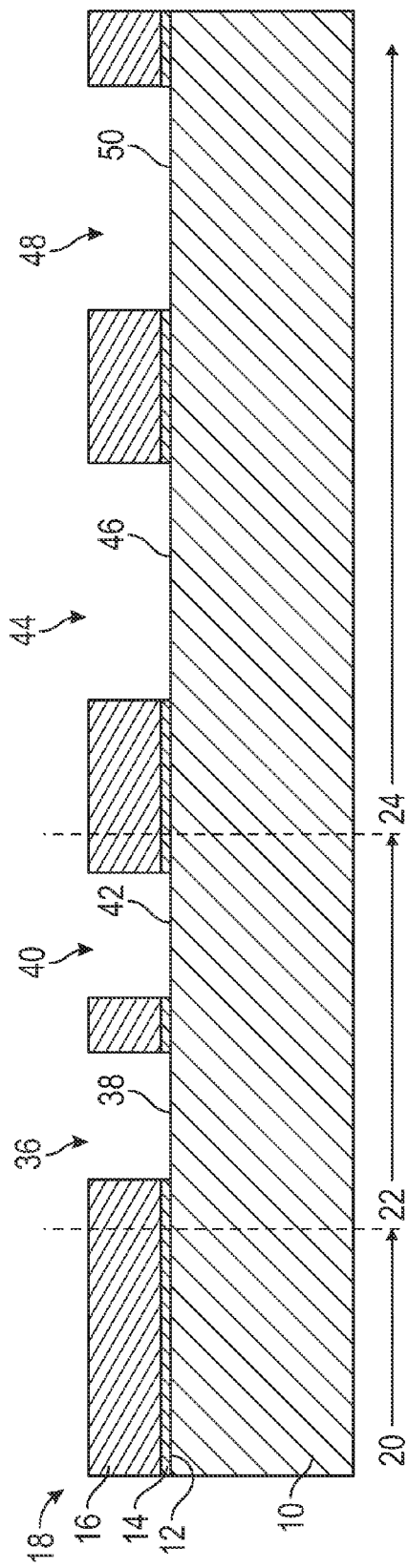

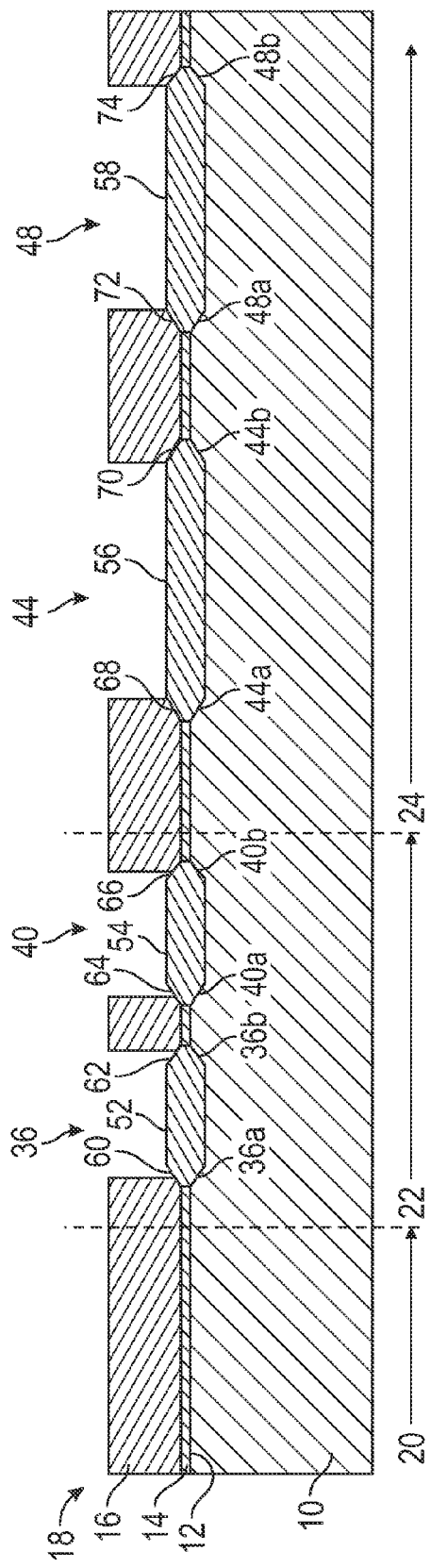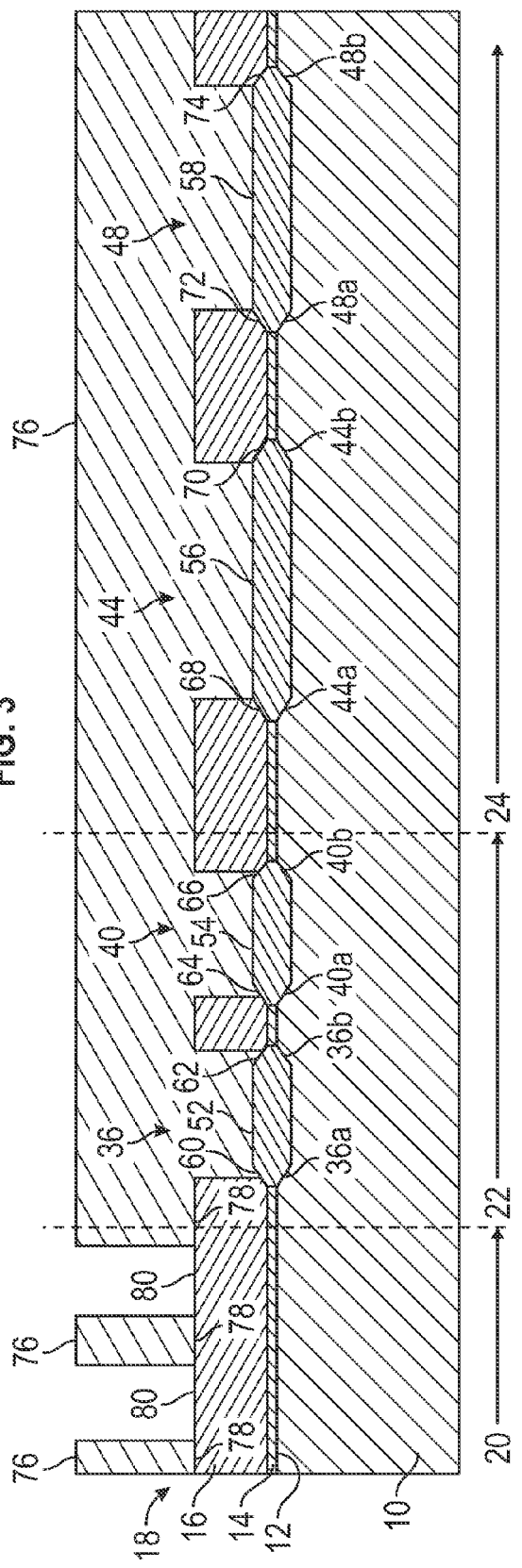

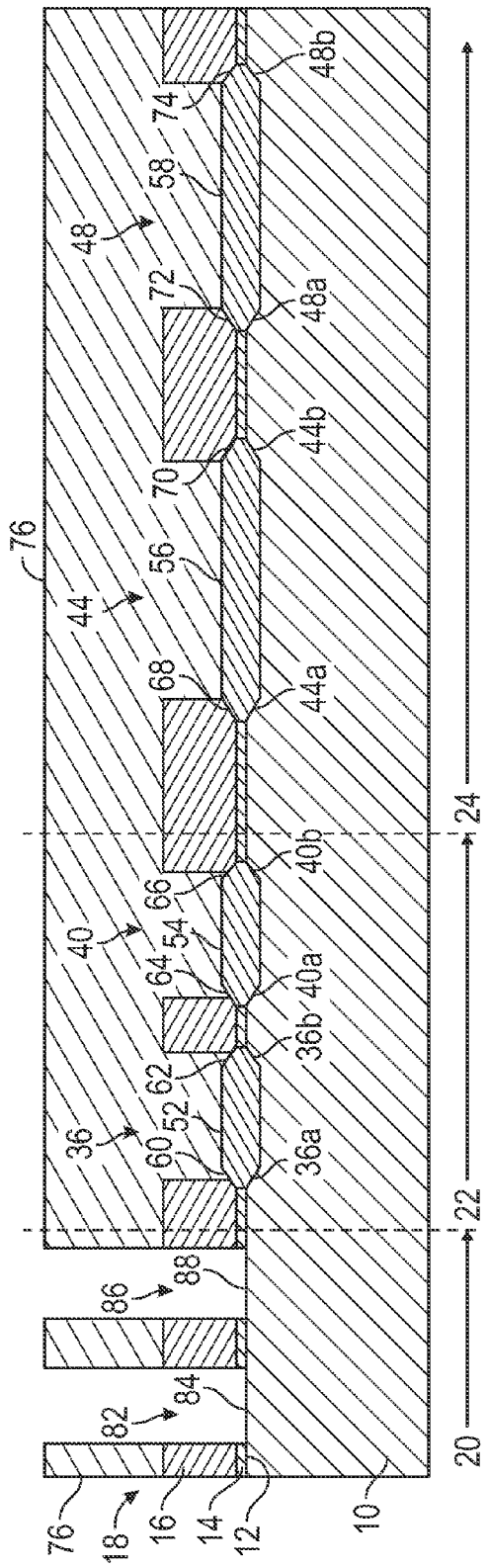
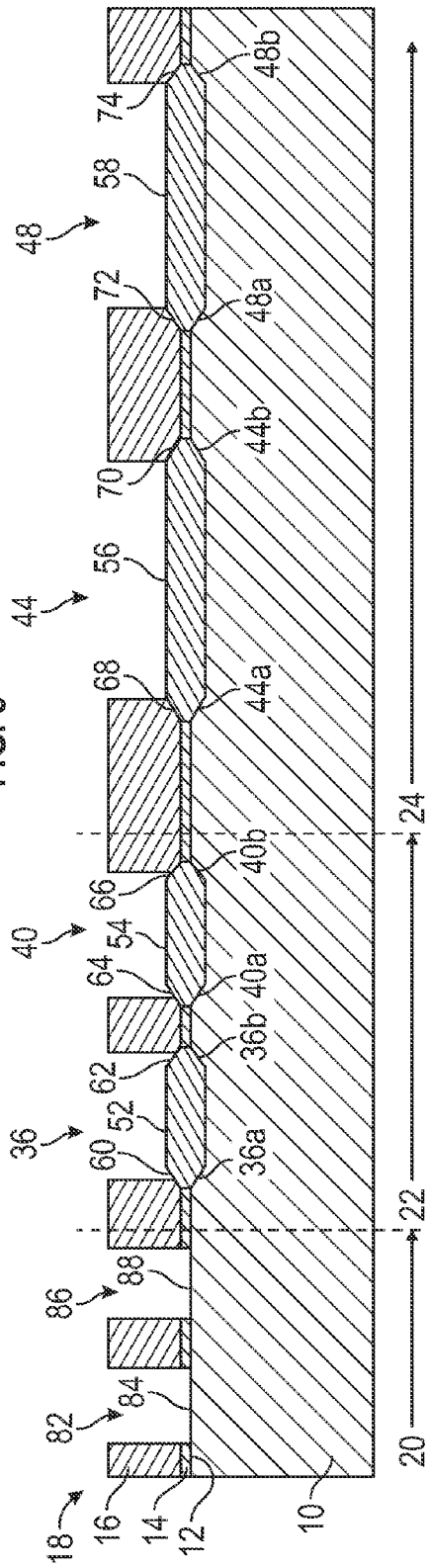

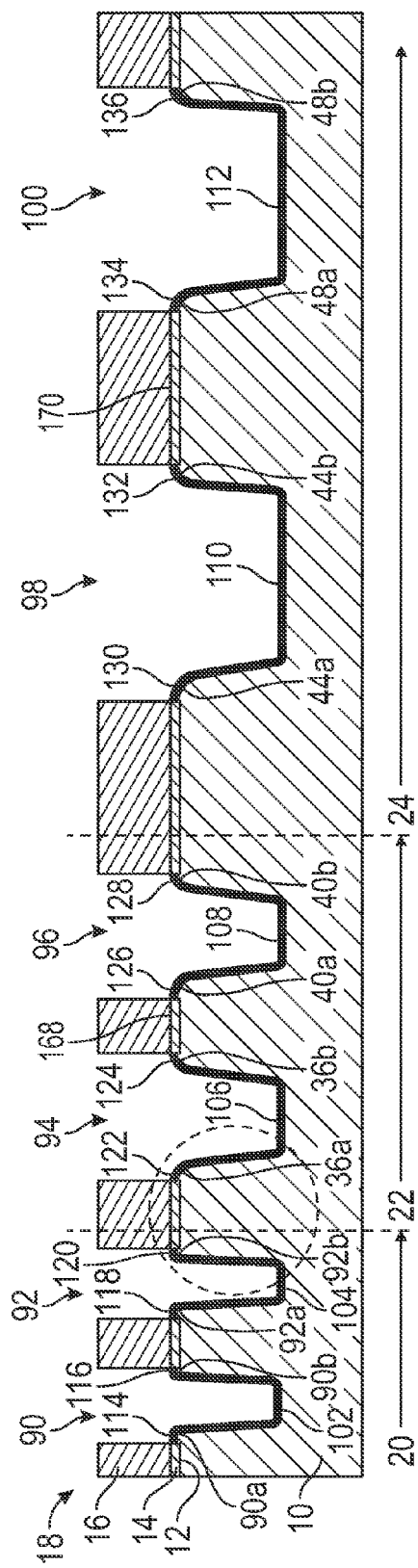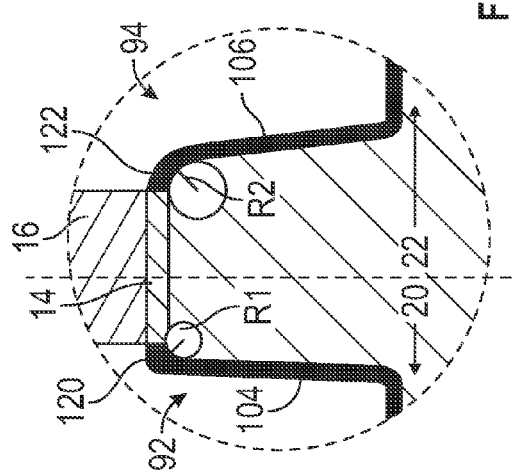
FIG. 9
FIG. 10

METHODS FOR FABRICATING DEVICE SUBSTRATES AND INTEGRATED CIRCUITS

TECHNICAL FIELD

The present disclosure generally relates to methods for fabricating device substrates and integrated circuits. More particularly, the present disclosure relates to methods for fabricating device substrates having STI trenches with different trench corners in low voltage regions and medium and/or high voltage regions thereof, as well as methods for fabricating integrated circuits having low and medium and/or high voltage devices on such device substrates.

BACKGROUND

In modern integrated circuits, a very high number of individual semiconductor devices, such as field effect transistors in the form of CMOS, NMOS, and PMOS transistors, resistors, capacitors and the like, are formed on a single chip area. However, such semiconductor devices should be properly isolated from one another to function properly. When semiconductor devices are not properly isolated from one another, leakage currents may occur, causing power dissipation, unwanted electric fields, noise-margin degradation, and voltage shift on dynamic nodes.

Shallow trench isolation (STI) structures improve electromagnetic isolation between semiconductor devices. To form an STI structure, typically a narrow trench is formed in a semiconductor substrate and the trench is filled with an insulating material prior to fabrication of semiconductor devices.

After filling the trench, it is sometimes found that sharp corners or divots form in the isolation material during processes such as etching and deglazing. To reduce the tendency of such sharp corners and divots to form, the technique of nitride pull back was developed. During the nitride pull back process, a nitride layer is formed over the substrate and the STI trench is etched through the nitride layer and into the substrate. Nitride pull back involves laterally recessing the edge of the nitride layer from the corner of the STI trench at the interface between the substrate and nitride layer to form a broader corner or shoulder from the substrate. The trench and lateral recesses are then filled with isolation material. This technique allows the deposited isolation material to extend upward and outward from the isolation trench over the trench corners, thereby reducing the tendency of sharp corners or oxide divots to form in the trench isolation material during subsequent processing.

Even after implementing nitride pullback, however, the profile shape of trench corners formed by the substrate may be sufficiently sharp or angular to allow formation of strong electrical fields at these corners that interfere with the operation or performance of adjacent medium or high voltage semiconductor devices. These unintentional electric fields interfere by, for example, producing undesirable kinks in the I-V characteristics of the adjacent and/or other nearby semiconductor devices, as well as generating higher off-current and degrading any gate oxide. These issues are of less concern for low voltage devices (i.e., semiconductor devices having operating voltages of no more than about 1.4 V), but become more severe in the presence of medium and high voltage devices (i.e., semiconductor devices having operating voltages of at least about 5 volts (V). Other techniques for forming more rounded trench corners that would minimize or avoid these problems for medium and high voltage devices presently exist. However, using those same techniques for forming trench corners proximate low voltage devices on semiconductor devices and integrated circuits often causes other problems including excessive silicon consumption and inability to meet strict active design requirements.

Accordingly, it is desirable to provide methods for fabricating integrated circuits that have a low voltage device, as well as a medium voltage device, a high voltage device, or both, and STI trenches between the different voltage devices that have different trench corners suitable to properly isolate the different voltage devices. In addition, it is desirable to provide methods for fabricating device substrates having different voltage regions with STI trenches defining different voltage device-forming areas therein and having different trench corners suitable for different voltage devices to be formed thereon. Furthermore, other desirable features and characteristics of the methods and apparatus contemplated herein will become apparent from the subsequent detailed description of the invention and the appended claims, taken in conjunction with the accompanying drawings.

BRIEF SUMMARY

Methods are provided for fabricating device substrates having rounded trench corners in medium and high voltage regions thereof, as well as methods for fabricating integrated circuits including such device substrates. In an exemplary embodiment, the method for fabricating a device substrate comprises the steps of: providing a semiconductor substrate with a substrate surface and having a low voltage (LV) region and a second voltage region that is either a medium voltage (MV) region or a high voltage (HV) region; and thermally oxidizing a trench-forming area on the substrate surface in the second voltage region to form a silicon oxide layer, wherein the silicon oxide layer has birds beak edges that extend in opposite directions and form rounded trench shoulders of the semiconductor substrate in the second voltage region. The method further comprises: forming an LV trench in the semiconductor substrate in the LV region such that the semiconductor substrate has an LV shoulder; forming a trench in the silicon oxide layer and semiconductor substrate in the second voltage region such that the semiconductor substrate has a rounded trench shoulder adjacent a birds beak edge; and removing the birds beak edge in the second voltage region. Additional steps of the method include: forming an oxide layer lining each of the LV trench and LV shoulder in the LV region, wherein the LV shoulder and the oxide layer thereon form an LV trench corner; and forming an oxide layer lining each of the trench and rounded trench shoulder in the second voltage region, wherein the rounded trench shoulder in the second voltage region and oxide layer thereon form a rounded trench corner in the second voltage region that is more rounded than the LV corner.

In another exemplary embodiment, a method for fabricating a device substrate comprises the steps of: providing a semiconductor substrate with a substrate surface and having a low voltage (LV) region, a second voltage region that is either a medium voltage (MV) region or a high voltage (HV) region, and a third voltage region that is either a medium voltage (MV) region or a high voltage (HV) region; thermally oxidizing a trench-forming area on the substrate surface in the second voltage region to form a silicon oxide layer, wherein the silicon oxide layer has birds beak edges that extend in opposite directions and form rounded trench shoulders of the semiconductor substrate in the second voltage region; thermally oxidizing a trench-forming area on the substrate surface in the third voltage region to form a silicon oxide layer, wherein the silicon oxide layer has birds beak edges that extend in opposite directions and form rounded trench shoulders of the semiconductor substrate in the third voltage region. This embodiment of the method further comprises: forming an LV trench in the LV region by removing a portion of the semiconductor substrate from within an LV trench-forming area in the LV region such that the semiconductor substrate has an LV shoulder; forming a trench in the second voltage region by removing a portion of the silicon oxide layer and a portion of the semiconductor substrate from within a trench-forming area in the second voltage region, but not removing the birds beak edges, wherein the semiconductor substrate has a rounded trench shoulder; forming a trench in the third voltage region by removing a portion of the silicon oxide layer and a portion of the semiconductor substrate from within a trench-forming area in the third voltage region, but not removing the birds beak edges, wherein the semiconductor substrate has a rounded trench shoulder; and then removing the birds beak edges in each of the second and third voltage regions. Furthermore, the method includes forming an oxide layer lining each of the LV trench and LV shoulder in the LV region, wherein the LV shoulder and the oxide layer thereon form an LV trench corner; forming an oxide layer lining each of the trench and rounded trench shoulder in the second voltage region, wherein the rounded trench shoulder in the second voltage region and oxide layer thereon form a rounded trench corner in the second voltage region that is more rounded than the LV corner; and forming an oxide layer lining each of the trench and rounded trench shoulder in the third voltage region, wherein the rounded trench shoulder in the third voltage region and oxide layer thereon form a rounded trench corner in the third voltage region that is more rounded than the LV corner.

In still another embodiment, a method for fabricating an integrated circuit, the method comprising the steps of: providing a semiconductor substrate with a substrate surface and having a low voltage (LV) region and a second voltage region that is either a medium voltage (MV) region or a high voltage (HV) region; and thermally oxidizing a trench-forming area on the substrate surface in the second voltage region to form a silicon oxide layer, wherein the silicon oxide layer has birds beak edges that extend in opposite directions and form rounded trench shoulders of the semiconductor substrate in the second voltage region. The method for fabricating an integrated circuit further comprises: forming an LV trench in the semiconductor substrate in the LV region such that the semiconductor substrate has an LV shoulder; forming a trench in the silicon oxide layer and semiconductor substrate in the second voltage region such that the semiconductor substrate has a rounded trench shoulder adjacent a birds beak edge; and removing the birds beak edge in the second voltage region. Additional steps for this embodiment include: forming an oxide layer lining each of the LV trench and LV shoulder in the LV region, wherein the LV shoulder and the oxide layer thereon form an LV trench corner; and forming an oxide layer lining each of the trench and rounded trench shoulder in the second voltage region, wherein the rounded trench shoulder in the second voltage region and oxide layer thereon form a rounded trench corner in the second voltage region that is more rounded than the LV corner. The method for fabricating an integrated circuit further also comprises: forming an LV device having an operating voltage of no more than about 1.4 volts (V) in the LV region; and forming an MV device or an HV device having an operating voltage of at least about 5 V in the second voltage region.

BRIEF DESCRIPTION OF THE DRAWINGS

The various embodiments will hereinafter be described in conjunction with the following drawing figures, wherein like numerals denote like elements, and wherein:

FIGS. 1-9 and 11-12 are cross-sectional views of a device substrate and integrated circuit in various stages of production in accordance with an exemplary embodiment; and FIG. 10 is a close-up cross-sectional view of a portion of the device substrate of FIG. 9.

DETAILED DESCRIPTION

Figure 7:
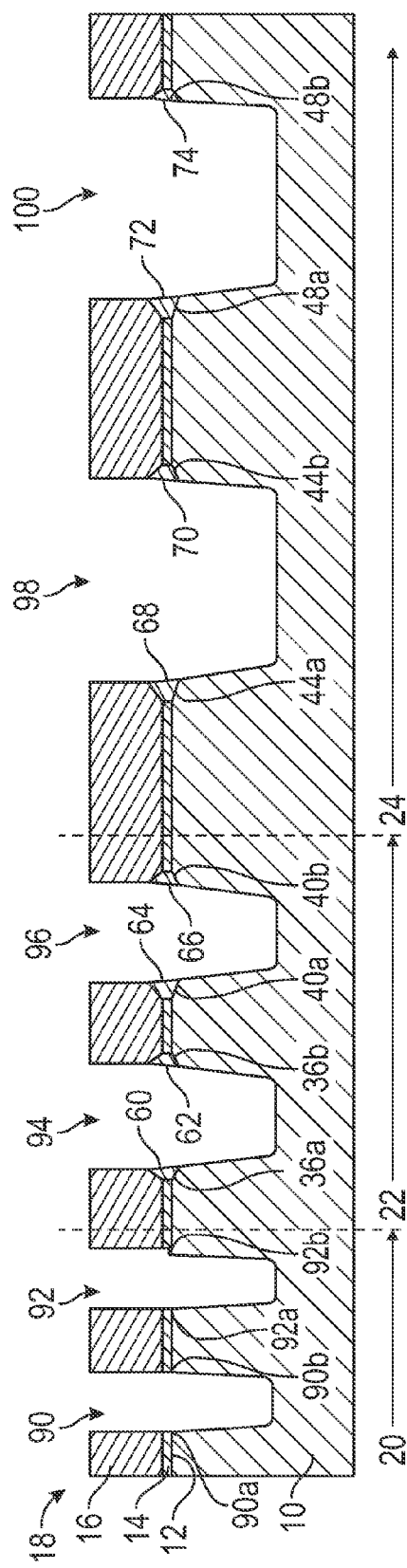

The following detailed description is merely exemplary in nature and is not intended to limit the various embodiments disclosed herein or the application and uses thereof. Furthermore, there is no intention to be bound by any theory presented in the preceding background or the following detailed description.

As described above, when low voltage devices and medium or high voltage devices are both on the same device substrate and are separated by conventional STI trenches, relatively sharp trench corners of the STI trenches allow unintended electric fields to develop. These unintended electric fields interfere with performance of the medium and high voltage devices, but not necessarily with the low voltage devices. Creating more rounded trench corners across the device substrate during its fabrication using aggressive STI liner thermal oxidation is not an acceptable solution because other problems arise proximate to the low voltage devices, including excessive silicon consumption and inability to meet strict active design requirements.

Accordingly, the various embodiments contemplated and described herein provide methods for fabricating device substrates upon which various voltage devices may be formed adjacent STI trenches with differently shaped trench corners, i.e., trench corners adjacent low voltage device-forming areas on the device substrate and trench corners adjacent medium or high voltage device-forming areas that are more rounded than the trench corners adjacent low voltage device-forming areas. The rounded trench corners adjacent medium or high voltage device-forming areas minimize interference with the performance of MV or HV devices to be formed thereon. Methods for fabricating integrated circuits using the device substrate are also provided herein.

FIGS. 1-9 and 11-12 are cross-sectional views of a semiconductor substrate 10 in various stages of fabrication provided to describe a method for fabricating the above described device substrate 18 and integrated circuit 140, according to an exemplary embodiment. Initially, as shown in FIG. 1, the method includes providing a semiconductor substrate 10 having a substrate surface 12. As used herein, the term "semiconductor substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The semiconductor material is preferably a silicon substrate. The silicon substrate may be a bulk silicon wafer, as illustrated, or may be a thin layer of silicon on an insulating layer (commonly known as silicon-on-insulator or SOI) that, in turn, is supported by a carrier wafer.

With reference still to FIG. 1, the method may further include forming a pad nitride layer 16 overlaying the semiconductor substrate 10 on the substrate surface 12 to form a device substrate 18. As used herein, the terms "overlay" and "overlaying" include the term "on," as when one layer is in physical contact with another layer, or "over," such as when a first layer overlies a second layer with a third layer in between the first layer and the second layer. It is noted that the method may also advantageously include overlaying a pad oxide layer 14 on the semiconductor substrate 10, as shown in the embodiment of FIG. 1. More particularly, the pad oxide layer 14 may be formed by thermal oxidation or deposited directly on the substrate surface 12 of the semiconductor substrate 10, and the pad nitride layer 16 deposited on the pad oxide layer 14. This arrangement of the pad oxide and pad nitride layers 14, 16 provides protection against deformation of the pad nitride layer 16 during later processing steps. In some embodiments, the pad oxide layer 14 may have a thickness of from about 50 to about 150 angstroms (Å). Also, in some embodiments, the pad nitride layer 16 may have a thickness of from about 1000 to about 2000 Å.

The resulting device substrate 18 has a low voltage (LV) region 20 and a second voltage region 22, which is either a medium voltage (MV) region or a high voltage (HV) region. It is noted that in some embodiments, the device substrate 18 may further include a third voltage region 24 that may also be either an MV region or an HV region. For example, without limitation, as shown in FIGS. 1-9, in an exemplary embodiment, the device substrate 18 has an LV region 20, an MV region 22 adjacent to the LV region 20, and an HV region 24 adjacent to the MV region 22 and on the opposite side of the MV region from the LV region. This arrangement of different voltage regions 20, 22, 24 may be varied as long as the device substrate 18 includes at least one LV region 20 and at least a second voltage region 22 that may be either an MV region or an HV region. Further variations that are not specifically shown include embodiments in which the wafer includes an LV region and one HV region adjacent to the LV region, or in which the device substrate includes an LV region, an HV region adjacent thereto, and an MV region adjacent to the HV region. Other possible embodiments include device substrates having an LV region, a first HV region adjacent to the LV region, and another HV region adjacent to the first HV region, or even device substrates having two HV regions that are both adjacent to the LV region (for example, the LV region may be located in between the two HV regions). Furthermore, some embodiments may use device substrates that have an LV region, an HV region adjacent thereto, as well as an MV region adjacent to the HV region and having one corner adjacent the corner of the LV region, and a second HV region adjacent to both the MV region and the LV region, similar to the red and black squares on a checker board. The device substrates may include more than one of any of the different voltage regions, or more than one of each of LV, MV, and HV regions and, as will be recognized by persons of ordinary skill in the relevant art, a nearly limitless number of arrangements are possible and contemplated as within the scope of the method described herein.

As also depicted in FIG. 1, the method for fabricating the device substrate 18 may further include patterning the device substrate 18 by overlaying a patterned first mask layer 26 thereon that provides guidance during formation of furrows in the device substrate 18. More particularly, in the embodiment shown in FIG. 1, the first mask layer 26 has a pattern covering the LV region 20 and covers a predetermined area 28 of the second voltage region 22, and leaves one or more furrow-forming areas 30 of the pad nitride layer 16 in the second voltage region 22 exposed. In one embodiment, as illustrated in FIG. 1, the patterned first mask layer 26 may also cover a predetermined area 32 of a third voltage region 24, leaving one or more furrow-forming areas 34 in third voltage region area 24 exposed.

With reference now to FIG. 2, after the patterning step, a furrow 36 is formed in in at least one of the furrow-forming areas 30 in the second voltage region 22. As shown in FIG. 2, the furrow 36 extends through the both the pad nitride layer 16 and pad oxide layer 14 (where present, as in this embodiment) to expose a trench-forming area 38 on the substrate surface 12 in the second voltage region 22. In simple terms, forming the furrow 36 involves removing material from the pad nitride layer 16 and the pad oxide layer 14 within the exposed furrow-forming area 30. More specifically, the furrow 36 may be formed by any appropriate etching method known now or in the future to persons of ordinary skill that will remove the material as stated without removing material from the semiconductor substrate 10. In some embodiments, for example, forming the furrow 36 is performed by a plasma or "dry" etching process, such as without limitation, reactive ion etching (RIE). In some embodiments for example, without limitation, the furrow 36 may have a depth of from about 1050 to about 2150 angstroms (Å) and a width of from about 0.1 to about 2 microns.

As in the embodiment shown in FIG. 2, more than one furrow, such as furrows 36, 40, 44, 48, may be formed in the second (MV) and third (HV) voltage regions 22, 24 of the device substrate 18, and each furrow 36, 40, 44, 48 exposes a trench-forming area 38, 42, 46, 50, respectively, on the substrate surface 12. After the one or more furrows 36, 40, 44, 48 are formed, the first mask layer 26 is removed, leaving the partially furrowed device substrate 18 including the furrowed pad oxide layer 14, the furrowed pad nitride layer 16 and the semi-exposed substrate surface 12. Hereinafter, when a method step is expressed in terms of a single feature, such as a single furrow (e.g., furrow 36 of FIG. 2), it is to be understood that one or more furrows may in fact be present and that, when more than one furrow (e.g., furrows 36, 40, 44, 48 of FIG. 2) is actually present, the method step applies to each of the furrows present in a particular voltage region.

With reference now to FIG. 3, after removal of the first mask layer 26 from the partially furrowed device substrate 18, a silicon oxide layer 52 is formed, e.g. grown, in the furrow 36 on the trench-forming area 38 in the second voltage area 22. The silicon oxide layer 52 is typically grown using one or more oxidation methods, such as thermal oxidation, that convert a portion of the silicon material at the substrate surface 12, within the trench-forming area 38, to silicon oxide. The resulting silicon oxide material occupies a greater volume than the original silicon material so that the silicon oxide layer 52 fills the bottom of the furrow 36 and has a pillow-shaped cross-section with tapered birds beak edges 60, 62, as shown in FIGS. 3-5. The birds beak edges 60, 62 extend in opposite directions and protrude into the semiconductor substrate 10 and pad nitride layer 16, thereby forming rounded trench shoulders 36a, 36b of the semiconductor substrate 10 in the furrow 36 in the second voltage region 22. More particularly, fabrication techniques known as local oxidation of silicon, or LOCOS, are especially suitable for forming these silicon oxide layers 52 on the substrate surface 12 of the semiconductor substrate 10.

More particularly, in the embodiment shown in FIG. 3, a silicon oxide layer 52, 54, 56, 58 is formed in each of the furrows 36, 40, 44, 48 in the second (MV) and third (LV) voltage regions 22, 24, respectively. Each of the silicon oxide layers 52, 54 in the MV region 22 has oppositely extending birds beak edges 60, 62 and 64, 66, respectively, while each of the silicon oxide layers 56, 58 in the HV region 24 has oppositely extending birds beak edges 68, 70 and 72, 74, respectively. Consequently, each of the furrows 36, 40 in the MV region 22 has a pair of rounded trench shoulders 36a, 36b and 40a, 40b, respectively, of the semiconductor substrate 10 therein. Each of the furrows 44, 48 in the HV region 24 has a pair of rounded trench shoulders 44a, 44b and 48a, 48b, respectively, of the semiconductor substrate 10 therein. Each of the silicon oxide layers 52, 54, 56, 58, has a thickness of from about 50 Å to about 500 Å.

After all silicon oxide layers 52, 54, 56, 58 are formed in the furrows 36, 40, 44, 48, respectively, in MV and HV regions 22, 24, the method contemplated and being described herein may further include patterning the device substrate 18 again, as shown in FIG. 4, by overlaying a patterned second mask layer 76 thereon that provides guidance during formation of additional furrows in the device substrate 18. More particularly, as shown in FIG. 4, the second mask layer 76 covers the second voltage region 22, and also the third voltage region 24 when present, including any furrows 36, 40, 44, 48 and silicon oxide layers therein. Additionally, the second mask layer 76 covers a predetermined area 78 of the LV region 20, and leaves one or more furrow-forming areas 80 of the pad nitride layer 16 in the LV region 20 exposed.

With reference now to FIG. 5, after the patterning step, an LV furrow 82 is formed in in at least one of the furrow-forming areas 80 (see FIG. 4) in the LV region 20. As shown in FIG. 5, the furrow 82 extends through both the pad nitride layer 16 and the pad oxide layer 14 (where present as in this embodiment) to expose an LV trench-forming area 84 on the substrate surface 12 in the LV region 20. Forming the furrow 82 involves removing material from the pad nitride layer 16 and the pad oxide layer 14 within the exposed furrow-forming area 80 and may be performed by any appropriate etching method, including without limitation, RIE, which will not remove material from the semiconductor substrate 10, as described above in connection with the prior furrow forming step.

As shown in the embodiment of FIG. 5, the method may involve forming two LV furrows 82, 86 in the LV region 20, each furrow 82, 86 exposing an LV trench-forming area 84, 88, respectively, of the substrate surface 12. In some embodiments, without limitation, the furrows 82, 86 may each independently have a depth of from about 1050 to about 2150 angstroms (Å) and a width of from about 0.03 to about 2 microns. After one or more furrows 82, 86 are formed in the LV region, the second mask layer 76 is removed so that, as shown in FIG. 6, the trench-forming areas 84, 88 are exposed, along with the silicon oxide layers 52, 54, 56, 58 in the second and third voltage regions 22, 24, respectively. The furrowed device substrate 18 is now ready for further fabrication method steps.

Trenches are formed in the next step of the fabrication method, as shown in FIG. 7. Similar to forming furrows, trenches are generally formed by removing material from the exposed semiconductor substrate 10. The trenches may typically have a depth of from about 0.1 to about 0.4 microns and a width of from about 0.03 to about 2 microns. More specifically, an LV trench 90 is formed in the furrow 82 in the LV region 20 by removing material from the semiconductor substrate 10 from within the furrow 82. The LV trench 90 extends into the semiconductor substrate 10 such that the semiconductor substrate 10 has a pair of LV shoulders 90a, 90b in the LV trench 90. Another trench 94 is formed in the furrow 36 of the second voltage region 22 by removing material from the silicon oxide layer 52 and from the underlying semiconductor substrate 10. The trench 94 in the second voltage region 22 extends into the semiconductor substrate 10 such that the semiconductor substrate 10 has a pair of shoulders 94a, 94b in the trench 94. The trenches 90, 94 may, for example, be formed using shallow trench isolation (STI) techniques which involve plasma or "dry" etching methods to remove material as described above. The etching methods employed are typically anisotropic and result in minimal material removed from the pad oxide or pad nitride layers 14, 16.

More particularly, in this embodiment of the method shown in FIG. 7, a plurality of trenches 90, 92, 94, 96, 98, 100 are formed in the furrows 82, 86, 36, 40, 44, 48 of the device substrate 18. Two trenches 90, 92 are formed in the furrows 82, 86 of the LV region such that the semiconductor substrate 10 in each trench 90, 92 has a pair of trench shoulders 90a, 90b, 92a, 92b, respectively. Similarly, two trenches 94, 96 are formed in the second voltage (MV) region 22 and another two trenches 98, 100 are formed in the third voltage (HV) region 24. The semiconductor substrate 10 has a pair of rounded trench shoulders 36a, 36b, 40a, 40b, 44a, 44b, 48a, 48b in each of the trenches 94, 96, 98, 100, respectively, in the MV and HV regions 22, 24. It is noted that during formation of the trenches 94, 96, 98, 100 in the MV and HV regions 22, 24, while most of the material of the silicon oxide layers 52, 54, 56, 58 is removed, the birds beak edges 60, 62, 64, 66, 68, 70, 72, 74 remain overlaying the corresponding rounded trench shoulders 36a, 36b, 40a, 40b, 44a, 44b, 48a, 48b.

Figure 8:
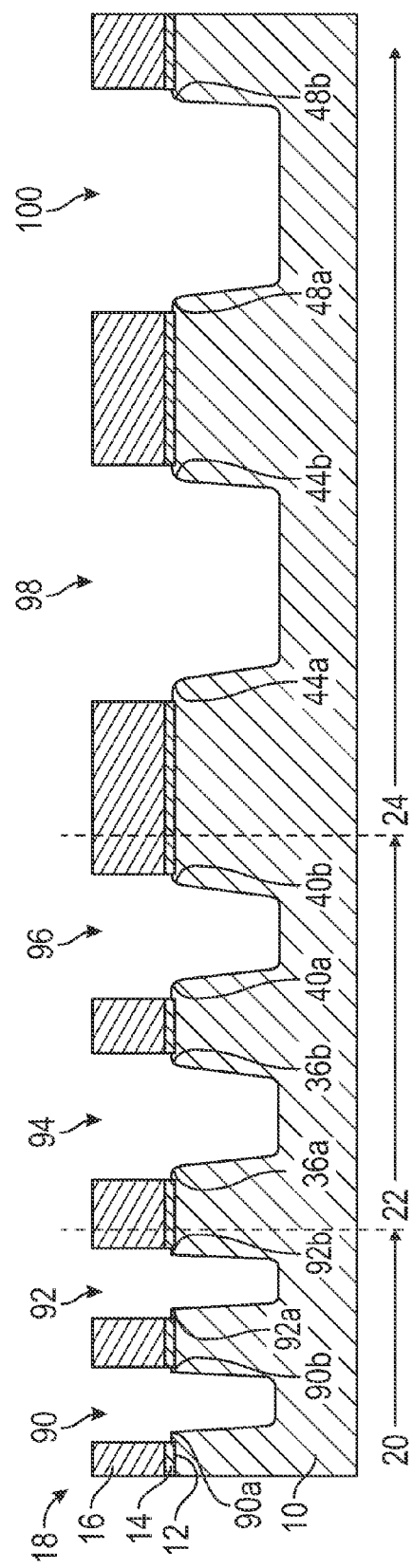

Turning now to FIG. 8, after formation of trenches in the device substrate 18, the method involves laterally recessing the pad oxide and pad nitride layers 14, 16 in each of the trenches 90, 94 in the LV region 20 and second voltage region 22, respectively. The pad oxide and pad nitride layers 14, 16, for example, may be recessed/pulled back from the edge of each shoulder 90a, 90b, 36a, 36b by a distance of from about 50 Å to about 250 Å. More particularly, as shown in the embodiment of FIG. 8, the pad oxide and nitride layers 14, 16 are laterally recessed proximate the shoulders 90a, 90b, 92a, 92b in the trenches 90, 92 in the LV region 20, as well as proximate the rounded trench shoulders 36a, 36b, 40a, 40b in the trenches 94, 96, respectively, in the MV region 22, and also proximate the rounded trench shoulders 44a, 44b and 48a, 48b in the trenches 98, 100, respectively, in the HV region 24.

The lateral recessing is sometimes referred to as "nitride pullback," and may be accomplished by any one of various nitride pullback techniques as are known now or in the future to persons of ordinary skill in the relevant art. For example, without limitation, in some embodiments, the nitride pull back may be accomplished by wet etching using an agent such as hot phosphorous. Alternatively, a plasma or other dry etch process may be used to perform the nitride pull back step. The pad oxide and pad nitride layers 14, 16 are recessed/pulled back from about 50 Å to about 250 Å from the edge of each shoulder 36a, 36b, 40a, 40b, 44a, 44b, 48a, 48b, respectively.

As also shown in FIG. 8, after nitride pullback has been performed, the method includes removing the birds beak edges 60, 62, 64, 66, 68, 70, 72, 74 in each of the trenches 94, 96, 98, 100 in the second and third voltage regions 22, 24, respectively. This exposes the rounded trench shoulders 36a, 36b, 40a, 40b, 44a, 44b, 48a, 48b in each of the trenches 94, 96, 98, 100. The step of removing birds beak edges from trenches may, for example without limitation, be performed utilizing a hydrofluoric acid solution comprising hydrofluoric acid diluted in deionized water (DHF). The volume ratio for deionized water to hydrofluoric acid should be from about 10:1 to about 300:1. In some embodiments, the DHF has a volume ratio of deionized water to hydrofluoric acid of about 25:1, or about 50:1, or about 100:1, or even about 300:1.

With reference now to FIG. 9, the method further includes forming oxide layers in the trenches. For example, an oxide layer 102 is formed lining the LV trench 90 and LV shoulders 90a and 90b in the LV region 20, and another oxide layer 106 is formed lining the trench 94 and the shoulders 36a and 36b thereof in the second voltage region 22. Each of the oxide layers 102, 106, independently, has a thickness of from about 20 Å to about 200 Å. The step of forming oxide layers lining each of the trenches may be performed simultaneously for example, without limitation, by thermal oxidation of exposed portions of the semiconductor substrate 10 therein. Thermal oxidation, for example, may be performed using a furnace, under dry conditions and in the presence of an oxygen-containing gas at a temperature of from about 800° C. to about 1150° C. The LV shoulder 90a and oxide layer 102 thereon form an LV trench corner 114 in the LV trench 90 in the LV region 20, and the rounded trench shoulder 36a and oxide layer 106 thereon form a rounded trench corner 122 in the trench 94 in the second voltage region 22. Furthermore, the rounded trench corner 122 in the second voltage region 22 is more rounded than the LV trench corner 114. More particularly, the rounded trench corner 122 of the trench 94 in the second voltage region 22 is sufficiently rounded to minimize interference with or alteration of electromagnetic fields created by devices to be formed in the second voltage region 22, which may be an MV or HV region. In other words, "sufficiently rounded" trench corners minimize interference with the operation or performance of MV or HV devices adjacent thereto. It is noted that the earlier described step of thermally oxidizing the trench-forming area 38 in the second voltage area 22 to form the silicon oxide layer 52 in the trench 94 (see FIGS. 3-6) also forms the rounded trench shoulders 36a, 36b on the semiconductor substrate 10 in the second voltage region 22 that are capable (when lined with an oxide layer 106 to form a rounded trench corner as described hereinafter) of minimizing interference with performance of a medium or high voltage device adjacent thereto (see, e.g., FIG. 10), wherein the medium or high voltage device has an operating voltage of at least about 5 V.

More particularly, in the exemplary embodiment being described and shown in FIG. 9, an oxide layer 102, 104 is formed lining each of the LV trenches 90, 92 and their respective shoulders 90a, 90b, 92a, 92b in the LV region 20. In the LV trenches 90, 92, each of the LV shoulders 90a, 90b, 92a, 92b and the oxide layers 102, 104 thereon, respectively, forms a corresponding LV trench corner 114, 116, 118, 120. Furthermore, an oxide layer 106, 108, 110, 112 is formed lining each of the trenches 94, 96, 98, 100 and their respective shoulders 36a, 36b, 40a, 40b, 44a, 44b, 48a, 48b in the second voltage (MV) and third voltage (HV) regions 22, 24. In the MV and HV regions 22, 24, each of the rounded trench shoulders 36a, 36b, 40a, 40b, 44a, 44b, 48a, 48b and the oxide layers 106, 108, 110, 112 thereon, respectively, forms a corresponding rounded trench corner 122, 124, 126, 128, 130, 132, 134, 136. Each of the rounded trench corners 122, 124, 126, 128, 130, 132, 134, 136 in the MV and HV regions 22 is, independently, sufficiently rounded to minimize interference with or alteration of performance of devices to be formed in the MV and HV regions 22, 24. Each of the oxide layers 102, 104, 106, 108, 110, 112, independently, has a thickness of from about 20 Å to about 200 Å.

The degree and difference in roundness between LV trench corners (e.g., any of LV trench corners 114, 116, 118, 120) and the rounded trench corners (e.g., any of 122, 124, 126, 128) in the second voltage region 22 is shown more clearly in FIG. 10. The dotted portion of the device substrate 18 shown in FIG. 9 is shown enlarged in FIG. 10. More particularly, the enlarged section shown in FIG. 10 includes an LV trench corner 120 in the LV region 20 and a rounded trench corner 122 in the second voltage region 22, which may be either an MV or HV region. The "roundness" of the different trench corners 120, 122 may be measured and compared using the "radius of curvature" R1, R2 for each respectively. As shown in FIG. 10, the "radius of curvature" is the radius of a circle whose circumference aligns with the curved surface of the trench corner. In some exemplary embodiments, the radius of curvature R1 for each LV trench corner is in a range of from about 1 nanometer (nm) to about 25 nm and the radius of curvature R2 for each trench corner in MV and HV regions is from about 5 nm to about 30 nm.

Generally, the greater the radius of curvature of a trench corner, the more rounded the trench corner is and the less likely the trench corner is to interfere with or alter the electromagnetic fields created by devices formed adjacent thereto. Thus, according to the method contemplated and described herein, the radius of curvature R2 for the rounded trench corner 122 of the second voltage region 22 (which is either an MV or an HV region) is greater than the radius of curvature R1 for the LV trench corner 120 of the LV region 20 (i.e., R2>R1). More particularly, a "sufficiently rounded" trench corner for the trench corner 122 of the second voltage region 22 will have a radius of curvature R2 that is at least 8% greater than the radius of curvature R1 for the LV trench corner 120 of the LV region 20.

Figure 11:
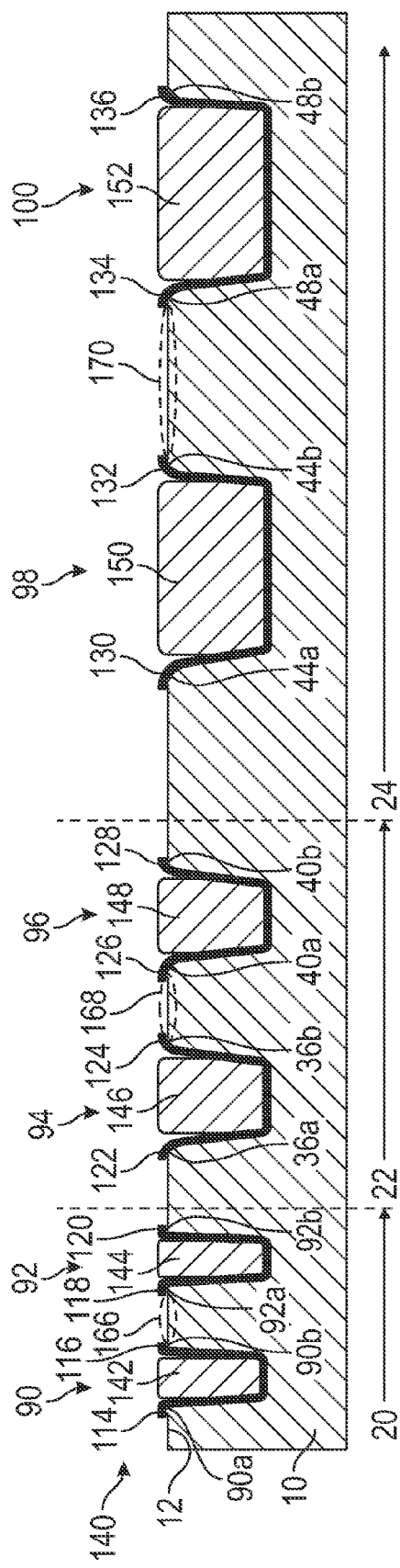

The method for fabricating the device substrate 18 may further include additional processing steps. Such additional fabrication and processing techniques include, for example without limitation, oxide fill in the trenches, chemical mechanical polishing (CMP), pad nitride layer removal, pad oxide layer removal, device well implantation, gate oxide formation, and poly-Si gate electrode deposition, among others. For example, as shown in FIG. 11, the pad oxide and pad nitride layers 14, 16 may be removed, thereby exposing at least one device-forming area 166, 168, 170 (indicated by dotted ovals in FIG. 11) in each of the LV region 20, the second voltage region 22 and the third voltage region 24, respectively, of the device substrate 18. Additionally, before using the device substrate 18 to fabricate an integrated circuit (described in further detail hereinafter), the LV trench 90 in the LV region 20 and the trench 94 in the second voltage region 22 are typically filled with an isolation material 142, 146, respectively, such as, without limitation, silicon dioxide or another suitable dielectric material. Where the trenched device substrate 18 also includes a third voltage region 24 with a trench 98 therein, that trench 98 is also filled with an isolation material 150. More particularly, as shown in FIG. 11, all of the trenches 90, 92, 94, 96, 98, 100 of the device substrate 18 may be filled with isolation material 142, 144, 146, 148, 150, 152, respectively.

Figure 12:
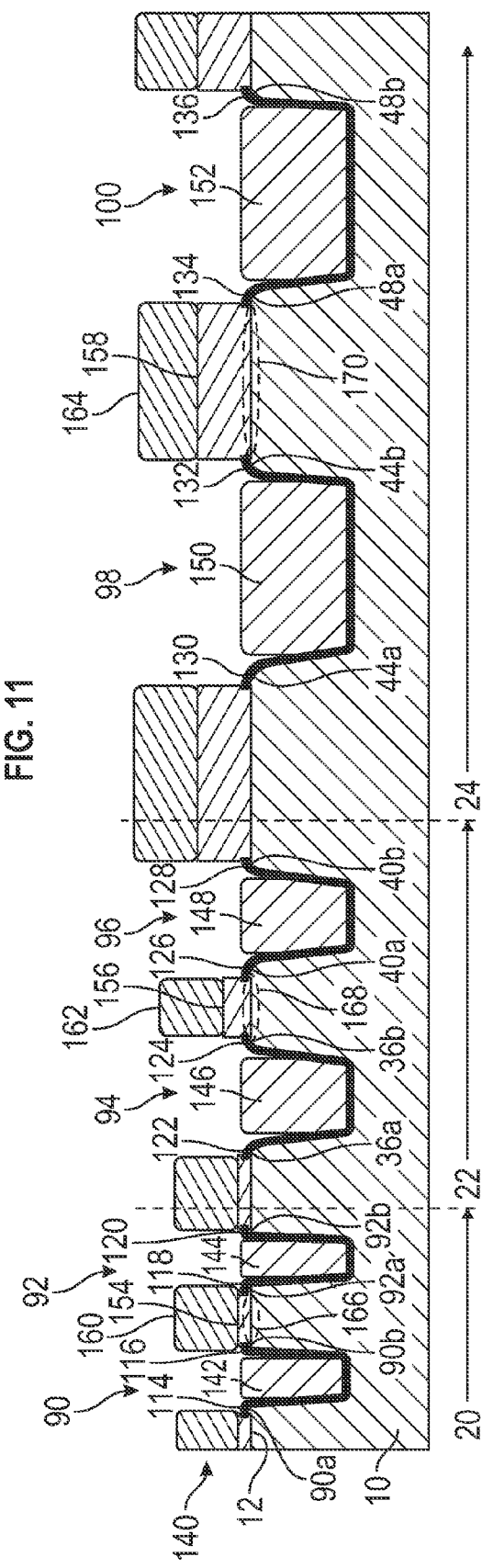

In another exemplary embodiment, a method for fabricating an integrated circuit 140 is provided. An integrated circuit 140 fabricated in accordance with the presently described method is shown schematically in FIG. 12. In general, the method comprises fabricating a device substrate 18 as described above in connection with FIGS. 1-9, and forming different voltage devices of the device substrate 18 in the different voltage regions 20, 22, 24. As described above in connection with FIG. 11, in some embodiments, the device substrate 18 may be prepared by first removing the pad oxide and pad nitride layers 14, 16 and filling the trenches 90, 92, 94, 96, 98, 100 with isolation material 142, 144, 146, 148, 150, 152, respectively. As shown in FIG. 12, the method may then involve forming a gate oxide layer 154, 156 and 158 on at least one device-forming area 166, 168, 170 (indicated by dotted ovals in FIG. 12), on the semiconductor substrate 10, in each of the voltage regions 20, 22, 24, respectively. Generally, the thicknesses of the gate oxide layers increase from the LV region 20, to the MV region 22 and to the HV region 24. More particularly the thickness of the gate oxide layer 154 in the LV region 20 is typically from about 16 Å to about 30 Å, while the thickness of the gate oxide layer 156 in the MV region 22 is typically from about 100 Å to about 250 Å. The thickness of the gate oxide layer 158 in the HV region 24 is typically from about 400 Å to about 1000 Å.

Next, in an exemplary embodiment, a device such as a low voltage (LV) device 160, shown in FIG. 12, is formed in the LV region 20 of the trenched device substrate 18. More particularly, for example, the LV device 160 has an operating voltage of no more than about 1.4 volts (V) and is formed on the gate oxide layer 154 in the LV region 20. It is noted that in some embodiments, more than one LV device 160 may be formed in the LV region 20 on the device substrate 18. In other embodiments, the device substrate 18 may have more than one LV region, each of which may have one more additional LV devices formed thereon.

The method for fabricating the integrated circuit 140 further comprises the step of forming a second voltage device 162, which may be either an MV device or an HV device, having an operating voltage of at least about 5 V, in the second voltage region 22 of the device substrate 18. In the embodiment shown in FIG. 12, the second voltage device is an MV device 162 formed overlaying the oxide layer 156 in the MV region 22. While not shown per se, it is noted that in some embodiments, more than one voltage device, which are either MV devices or HV devices, may be formed in the second voltage region 22 of the device substrate 18. Also, in some embodiments, the second voltage region may be an MV region 22 with two MV devices formed therein, and the device substrate 18 may further comprise a third voltage region which may be an HV region 24 having one or more HV devices 164 formed therein. For example, the embodiment shown in FIG. 12 includes a third voltage region which is an HV region 24, and an HV device 164 formed overlaying the gate oxide layer 158 in the HV region 24.

As will be recognized by persons of ordinary skill, there are many variations on the number and arrangement of different voltage regions that may be present on the integrated circuit 140 and the corresponding voltage devices formed thereon, in addition to those described above. For example, some embodiments of the integrated circuit 140, such as those where the second voltage region 22 is an MV region, may have multiple MV devices formed thereon, and where the second voltage region 22 is an HV region, there may be multiple HV devices formed thereon. In other embodiments, the integrated circuit 140 may have additional voltage regions beyond the second voltage region, such as a third or fourth voltage regions, each of which may have a separate corresponding voltage device formed thereon. For example, without limitation, where the integrated circuit has second and third voltage regions, and the second voltage region is an HV region, an HV device would be formed thereon, and the third voltage region is an MV region, an MV device would be formed thereon.

In another exemplary embodiment (best viewed in FIG. 10), a device substrate 18 produced by the above-described fabrication method is provided having a semiconductor substrate 10 having a substrate surface 12, an LV region 20, and a second voltage region 22 which is either a MV region or a HV region. The device substrate 18 also has an LV trench 90 in the LV region 20. The LV trench 90 has an LV shoulder 90a and an LV oxide layer 102 lining the LV trench 90 and the LV shoulder 90a. Together, the LV shoulder 90a and the oxide layer 102 thereon form an LV trench corner 114 having a radius of curvature R1 (see, e.g., FIG. 10) in a range of from about 1 nm to about 25 nm. The LV oxide layer 102 has a thickness of from about 20 Å to about 200 Å.

Additionally, the device substrate 18 has a second trench 94 in the second voltage region 22, and the second trench 94 has a shoulder 36a and an oxide layer 106 lining the second trench 94 and its shoulder 36a. The shoulder 36a of the second trench 94 and oxide layer 106 thereon form a trench corner 122 that is more rounded than the LV trench corner 114. Generally, the trench corner 122 in the second voltage region 22 is, as described above, sufficiently rounded to minimize interference with or alteration of electromagnetic fields created by devices to be formed adjacent thereto. In other words, the rounded trench corner 122 of the trench 94 in the second voltage region 22 of the device substrate 140 is sufficiently rounded to minimize interfering with the operation or performance of a medium voltage device (MV) 162 or a high voltage (HV) 164 device to be formed adjacent thereto (see, e.g., FIG. 12). The trench corner 122 in the second voltage region 22 has a radius of curvature R2 that is at least 8% greater than the radius of curvature R1 of the LV corner 114 in the LV region 20. Additional details and possible alternatives for the device substrates contemplated herein have been described and proposed hereinabove in connection with the description of the methods for fabricating them.

One or more of the LV, second and third devices may be, for example, without limitation, a transistor, a resistor, or a memory cell. Furthermore, LV devices have an operating voltage of no more than about 1.4 V, while MV and HV devices each, independently, have an operating voltage of at least about 5 V.

While at least one exemplary embodiment has been presented in the foregoing detailed description of the semiconductor devices and methods for making same, it should be appreciated that a vast number of variations exist. It should also be appreciated that the exemplary embodiment or exemplary embodiments are only examples, and are not intended to limit the scope, applicability, or configuration of the semiconductor devices or methods described herein in any way. Rather, the foregoing detailed description will provide those skilled in the art with a convenient road map for implementing an exemplary embodiment of the semiconductor device and methods for making same. It being understood that various changes may be made in the function and arrangement of elements described in an exemplary embodiment without departing from the scope of the semiconductor devices and methods for making same, as set forth in the appended claims

What is claimed is:

1. A method for fabricating a device substrate, the method comprising the steps of:
providing a semiconductor substrate with a substrate surface and having a low voltage (LV) region and a second voltage region that is either a medium voltage (MV) region or a high voltage (HV) region;
thermally oxidizing a trench-forming area on the substrate surface in the second voltage region to form a silicon oxide layer, wherein the silicon oxide layer has birds beak edges that extend in opposite directions and form rounded trench shoulders of the semiconductor substrate in the second voltage region;
forming an LV trench in the semiconductor substrate in the LV region such that the semiconductor substrate has an LV shoulder;
forming a trench in the silicon oxide layer and semiconductor substrate in the second voltage region such that the semiconductor substrate has a rounded trench shoulder adjacent a birds beak edge;

removing the birds beak edge in the second voltage region; and forming an oxide layer lining each of the LV trench and LV shoulder in the LV region, wherein the LV shoulder and the oxide layer thereon form an LV trench corner; and forming an oxide layer lining each of the trench and rounded trench shoulder in the second voltage region, wherein the rounded trench shoulder in the second voltage region and oxide layer thereon form a rounded trench corner in the second voltage region that is more rounded than the LV corner.

2. The method of claim 1, wherein the rounded trench corner in the second voltage region is sufficiently rounded to minimize interference with performance of voltage devices to be formed adjacent thereto.

3. The method of claim 1, wherein after forming the oxide layers in the LV region and the second voltage region, respectively, the LV trench corner has a radius of curvature, $R_1$, and the rounded trench corner in the second voltage region has a radius of curvature, $R_2$, and wherein $R_2$ is at least 8% greater than $R_1$.

4. The method of claim 1, wherein the step of thermally oxidizing the trench-forming area also forms a rounded trench shoulder in the second voltage region that is capable, when lined with an oxide layer to form a rounded trench corner, of minimizing interference with performance of a medium or high voltage device adjacent thereto, wherein the medium or high voltage device has an operating voltage of at least about 5 V.

5. The method of claim 1, wherein the steps of forming an LV trench in the LV region and forming a trench in second voltage region are performed simultaneously.

6. The method of claim 1, wherein the steps of forming an oxide layer in each of the LV and second voltage regions, respectively, are performed simultaneously.

7. The method of claim 1, wherein the steps of forming an oxide layer in each of the LV and second voltage regions, respectively, each forms an oxide layer having a thickness of from about 20 Angstroms (Å) to about 200 Å.

8. The method of claim 1, wherein, after providing the semiconductor substrate, the method further comprises the steps of:

forming a pad nitride layer overlaying the semiconductor substrate; and forming an LV furrow in the LV region that extends through the pad nitride layer to expose the LV trench-forming area on the substrate surface in the LV region, wherein the step of forming the LV trench is performed after formation of the furrow, and forming a furrow in the second voltage region that extends through the pad nitride layer to expose the trench-forming area on the substrate surface in the second voltage region, wherein the steps of thermally oxidizing to form the silicon oxide layer and forming the trench in the second voltage region are performed after formation of the furrow.

9. The method of claim 8, wherein the steps of forming an LV furrow in the LV region and forming a furrow in the second voltage region are each performed by etching.

10. The method of claim 8, wherein, prior to forming the oxide layers lining the LV trench in the LV region and the trench in the second voltage region, the method further comprises the step of laterally recessing the pad nitride layer proximate the LV shoulder in the LV region and proximate the rounded trench shoulder in the second voltage region.

11. A method for fabricating a device substrate, the method comprising the steps of:

providing a semiconductor substrate with a substrate surface and having:
 a low voltage (LV) region,
 a second voltage region that is either a medium voltage (MV) region or a high voltage (HV) region, and
 a third voltage region that is either a medium voltage (MV) region or a high voltage (HV) region;

thermally oxidizing a trench-forming area on the substrate surface in the second voltage region to form a silicon oxide layer, wherein the silicon oxide layer has birds beak edges that extend in opposite directions and form rounded trench shoulders of the semiconductor substrate in the second voltage region;

thermally oxidizing a trench-forming area on the substrate surface in the third voltage region to form a silicon oxide layer, wherein the silicon oxide layer has birds beak edges that extend in opposite directions and form rounded trench shoulders of the semiconductor substrate in the third voltage region;

forming an LV trench in the LV region by removing a portion of the semiconductor substrate from within an LV trench-forming area in the LV region such that the semiconductor substrate has an LV shoulder;

forming a trench in the second voltage region by removing a portion of the silicon oxide layer and a portion of the semiconductor substrate from within a trench-forming area in the second voltage region, but not removing the birds beak edges, wherein the semiconductor substrate has a rounded trench shoulder;

forming a trench in the third voltage region by removing a portion of the silicon oxide layer and a portion of the semiconductor substrate from within a trench-forming area in the third voltage region, but not removing the birds beak edges, wherein the semiconductor substrate has a rounded trench shoulder;

removing the birds beak edges in each of the second and third voltage regions; and forming an oxide layer lining each of the LV trench and LV shoulder in the LV region, wherein the LV shoulder and the oxide layer thereon form an LV trench corner;

forming an oxide layer lining each of the trench and rounded trench shoulder in the second voltage region, wherein the rounded trench shoulder in the second voltage region and oxide layer thereon form a rounded trench corner in the second voltage region that is more rounded than the LV corner; and forming an oxide layer lining each of the trench and rounded trench shoulder in the third voltage region, wherein the rounded trench shoulder in the third voltage region and oxide layer thereon form a rounded trench corner in the third voltage region that is more rounded than the LV corner.

12. The method of claim 11, wherein after forming the oxide layers in the LV region and the second voltage region, respectively, the LV trench corner has a radius of curvature, $R_1$, and the rounded trench corner in the second voltage region has a radius of curvature, $R_2$, and wherein $R_2$ is at least 8% greater than $R_1$.

13. The method of claim 11, wherein the steps of forming an LV trench in the LV region, forming a trench in the second voltage region, and forming a trench in the third voltage region are performed simultaneously.

14. The method of claim 11, wherein the steps of forming an oxide layer in each of the LV, second and third voltage regions, respectively, are performed simultaneously.

15. A method for fabricating an integrated circuit, the method comprising the steps of:
- providing a semiconductor substrate with a substrate surface and having a low voltage (LV) region and a second voltage region that is either a medium voltage (MV) region or a high voltage (HV) region;
- thermally oxidizing a trench-forming area on the substrate surface in the second voltage region to form a silicon oxide layer, wherein the silicon oxide layer has birds beak edges that extend in opposite directions and form rounded trench shoulders of the semiconductor substrate in the second voltage region;
- forming an LV trench in the semiconductor substrate in the LV region such that the semiconductor substrate has an LV shoulder;
- forming a trench in the silicon oxide layer and semiconductor substrate in the second voltage region such that the semiconductor substrate has a rounded trench shoulder adjacent a birds beak edge;
- removing the birds beak edge in the second voltage region; and
- forming an oxide layer lining each of the LV trench and LV shoulder in the LV region, wherein the LV shoulder and the oxide layer thereon form an LV trench corner;
- forming an oxide layer lining each of the trench and rounded trench shoulder in the second voltage region, wherein the rounded trench shoulder in the second voltage region and oxide layer thereon form a rounded trench corner in the second voltage region that is more rounded than the LV corner;
- forming an LV device having an operating voltage of no more than about 1.4 volts (V) in the LV region; and
- forming an MV device or an HV device having an operating voltage of at least about 5 V in the second voltage region.

16. The method of claim 15, wherein after forming the oxide layers in the LV region and the second voltage region, respectively, the LV trench corner has a radius of curvature, $R_1$, and the rounded trench corner in the second voltage region has a radius of curvature, $R_2$, and wherein $R_2$ is at least 8% greater than $R_1$.

17. The method of claim 16, wherein the steps of forming an LV trench in the LV region and forming a trench in second voltage region are performed simultaneously.

18. The method of claim 16, wherein the steps of forming an oxide layer in each of the LV and second voltage regions, respectively, are performed simultaneously.

19. The method of claim 16, wherein, after providing the semiconductor substrate, the method further comprises the steps of:
- forming a pad oxide layer overlaying the substrate surface;
- forming a pad nitride layer overlaying the pad oxide layer; and
- forming an LV furrow in the LV region that extends through the pad nitride and pad oxide layers to expose the LV trench-forming area on the substrate surface in the LV region, wherein the step of forming the LV trench in the second voltage region is performed after formation of the furrow, and
- forming a furrow in the second voltage region that extends through the pad nitride and pad oxide layers to expose the trench-forming area on the substrate surface in the second voltage region, wherein the steps of forming the oxide layer and forming the trench in the second voltage region are performed after formation of the furrow.

20. The method of claim 19, wherein, prior to forming the oxide layers lining the LV trench and the trench in the second voltage region, the method further comprises the step of laterally recessing the pad nitride layer proximate the LV shoulder in the LV region and proximate the rounded trench shoulder in the second voltage region.

* * * * *